United States Patent [19]
Toshima

[11] Patent Number: 5,900,105
[45] Date of Patent: May 4, 1999

[54] WAFER TRANSFER SYSTEM AND METHOD OF USING THE SAME

[75] Inventor: Masato Toshima, Sunnyvale, Calif.

[73] Assignee: Gamma Precision Technology, Inc., Santa Clara, Calif.

[21] Appl. No.: 08/677,136

[22] Filed: Jul. 9, 1996

[51] Int. Cl.[6] .................... H01L 21/3065; B65G 25/08
[52] U.S. Cl. .................. 156/345; 118/723 E; 118/723 I; 118/730; 118/719; 438/711; 414/220; 414/936; 414/938; 414/939; 414/940
[58] Field of Search ................. 204/298.25, 298.35, 204/192.32; 438/716, 710, 711, 730; 156/345 C, 345 PC, 345 PH, 345 PW, 345 WH, 345 MC; 414/217, 219, 220, 936, 937, 938, 939, 940; 118/719, 723 E, 723 I, 730

[56] References Cited

U.S. PATENT DOCUMENTS

| | | | |
|---|---|---|---|
| 3,923,342 | 12/1975 | Shannon | 414/936 X |
| 4,676,884 | 6/1987 | Dinock et al. | 204/298 |
| 4,785,962 | 11/1988 | Toshima | 220/260 |
| 4,795,299 | 1/1989 | Boys et al. | 414/217 |
| 5,013,385 | 5/1991 | Maher et al. | 156/345 |
| 5,133,284 | 7/1992 | Thomas et al. | 118/719 |
| 5,198,634 | 3/1993 | Mattson et al. | 219/121.43 |
| 5,275,521 | 1/1994 | Wada | 414/937 X |
| 5,292,393 | 3/1994 | Maydan et al. | 156/345 |
| 5,302,209 | 4/1994 | Maeda et al. | 118/719 |
| 5,346,578 | 9/1994 | Benzing et al. | 156/345 |
| 5,405,480 | 4/1995 | Benzing et al. | 156/345 |
| 5,429,070 | 7/1995 | Campbell et al. | 118/719 X |
| 5,513,765 | 5/1996 | Usui | 156/345 X |
| 5,525,159 | 6/1996 | Hama et al. | 118/723 I |
| 5,540,824 | 7/1996 | Yin et al. | 118/723 I X |
| 5,570,994 | 11/1996 | Somekh et al. | 414/939 X |
| 5,573,595 | 11/1996 | Dible | 118/723 E X |
| 5,611,861 | 3/1997 | Higashi | 118/719 |
| 5,759,268 | 6/1998 | Begin et al. | 118/52 |

*Primary Examiner*—Bernard Codd
*Attorney, Agent, or Firm*—Lyon & Lyon LLP

[57] ABSTRACT

A wafer transfer system is described for transferring a wafer while at substantially the same time another wafer is being processed. The wafer transfer system comprises, in one embodiment, a transfer chamber having a wafer transfer blade, a load lock chamber coupled to the transfer chamber, an atmospheric robot for loading and unloading the wafer into the load lock chamber, and a slider coupled to the wafer transfer blade for moving the wafer transfer blade between the transfer chamber and the load lock chamber. According to a preferred embodiment, the slider utilizes a magnetic coupling mechanism and a plurality of plasma sources are coupled to the transfer chamber. The plurality of plasma sources are arranged in a plurality of pairs of plasma sources. Each plasma source in a pair of plasma sources share the other plasma source's induction coils.

27 Claims, 11 Drawing Sheets

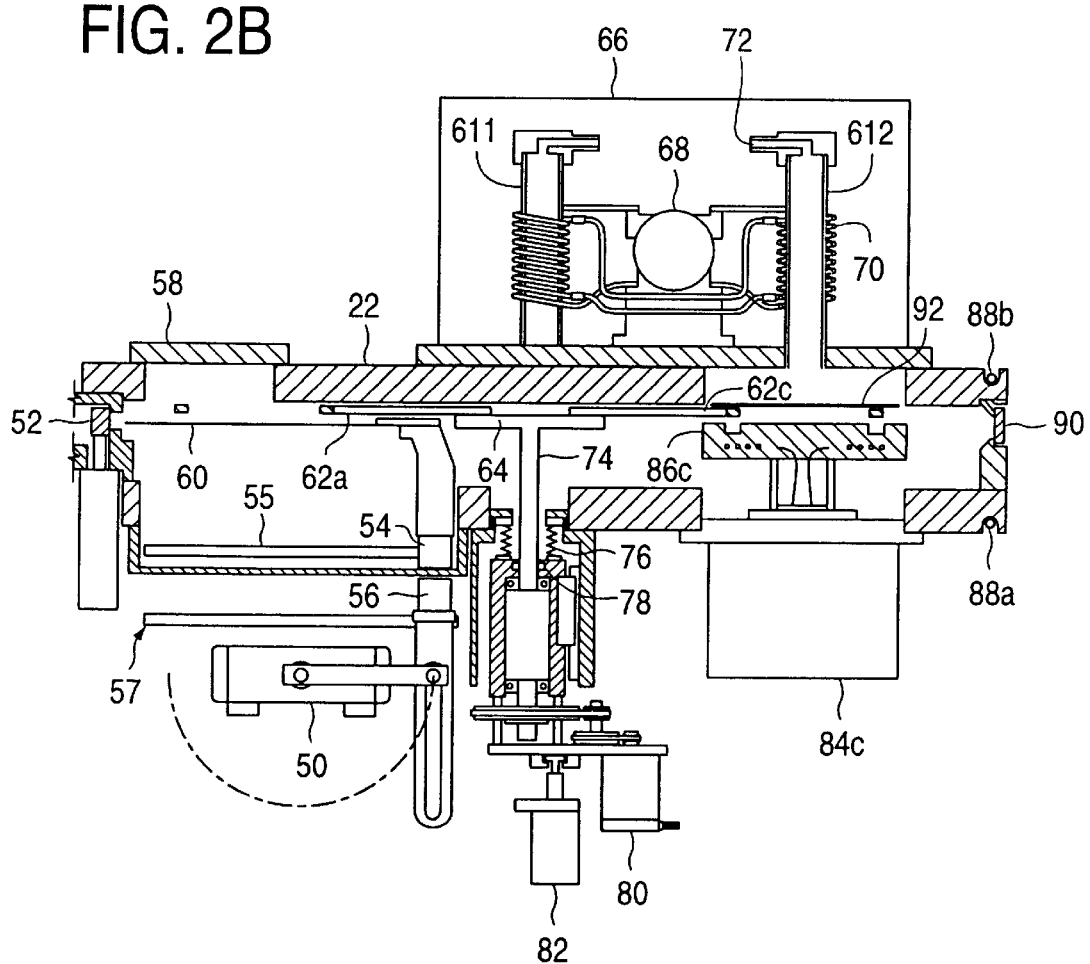

WAFER TRANSFER SYSTEM AND METHOD OF USING THE SAME

BACKGROUND OF THE INVENTION

1. Field of the Invention

The field of our invention relates generally to semiconductor manufacturing, and more particularly to an apparatus and method for stripping resist from a substrate in a transfer chamber, while at substantially the same time, another substrate is being transferred between a load lock chamber and the transfer chamber of the system. Therefore, throughput is increased because processing and transferring of the substrate occurs in parallel instead of as two separate events.

2. Description of Related Art

During the process of semiconductor fabrication, photoresist, a light sensitive film, is often deposited on a wafer surface and then "exposed" using high intensity light through a mask. The exposed photoresist is then dissolved off the wafer with developers. The pattern of photoresist remaining after development will prevent subsequent etch or implant operations in some areas while allowing etching or implant in other areas. Once the etch or implant operation is completed, the remaining photoresist is removed or stripped from the wafer surface.

A prior art chemical vapor deposition system 100 that can be adapted to remove photoresist from a wafer is illustrated in FIG. 1. The prior art system comprises a load lock chamber 125 and a transfer chamber 105. A complicated robot 130 with one platen 135, a first cassette 140 for holding wafers and a second cassette 150 are disposed within the load lock chamber 125. The transfer chamber 105 includes six fins (110a–110f) mounted to a common center 120 on one end of each fin. The other end of each of the fins (110a–110f) is coupled to a processing stage (115a–115f). There are six processing stages (115a–115f) in the transfer chamber 105.

Under the prior art system 100, the tact time was defined as the sum of the process time (typically about 15 seconds) plus loading time (typically about twenty-seven seconds) for a total of forty-two seconds. The process time is defined as the time that a wafer spends at each stage (e.g., 115a) in the transfer chamber 105 and the loading time is defined as the amount of time spent transferring a new (meaning "unprocessed" by system 100) or processed wafer between the load lock chamber 125 and the transfer chamber 105. Under the prior art system, when a wafer was being processed, a wafer could not be loaded. The converse was also true; when a wafer was being loaded, another wafer could not be processed. Thus, the wafer processing time and the wafer loading time were two separate events in the prior art system 100.

A typical loading sequence would comprise the following actions. For the sake of simplicity, only the movement of one fin is discussed as opposed to the entire fin assembly (which includes all the fins 110a–110f). Fin 110a would move up while the robot 130 would move with its platen 135 toward the fin 110a. The fin 110a would move down and transfer the processed wafer on to the platen 135 of the robot 130. The robot 130 would then retract and rotate toward a first cassette 140 or a second cassette 150. Assuming that the robot rotated toward first cassette 140, the robot 130 would then extend its platen 135 toward first cassette 140. The robot 130 would index and transfer the processed wafer back into the first cassette 140. After doing this, the robot 130 would retract and then index forward to the next wafer slot on the first cassette 140. The robot 130 would extend its platen 135 toward the first cassette 140. The robot 130 would index so that a new wafer is transferred onto the robot's platen 135. The robot 130 would then retract and rotate toward fin 110a. The robot 130 would then extend the platen 135 toward the fin 110A. The fin 110a (including the fin assembly) would move up to receive the new wafer. The robot 130 would retract after the wafer was transferred to the fin 110a. The fin 110a would then rotate towards processing stage 115b and then move down so that fin 110a is now located where fin 110b was located. In other words, all six fins (110a–110f) have moved in a counterclockwise direction since all six fins (110a–110f) are attached to a common center 120. Thus, fin 110a will then move down so that the wafer is now on processing stage 115b. The entire sequence of events typically takes about 27 seconds to unload a processed wafer from the transfer chamber to the load lock chamber and then back into a cassette (140 or 150) and to load a new wafer into the transfer chamber. During this transfer sequence, all processing stops.

Once a new wafer is introduced into the transfer chamber 105, processing of the wafer resumes. The processing time usually takes about 15 seconds. While a wafer is being processed in the transfer chamber 105, the robot 130 is inactive and no wafers are being loaded or unloaded between the load lock chamber 125 and the transfer chamber 105.

When a second wafer is introduced into the transfer chamber 105, the first wafer which was on processing stage 115b will be moved to processing stage 115c so that the new wafer may be placed on processing stage 115b. However, during the loading and unloading sequence, the processing of the wafers inside the transfer chamber 105 must cease. Thus, throughput is greatly reduced because the wafers cannot be processed in parallel with the wafers being loaded and unloaded between the load lock chamber 125 and the transfer chamber 105.

It was a common belief that if one sacrificed one of the process stages in the transfer chamber to act solely as a loading and unloading station, then a loss in throughput would occur. Therefore, all the previous solutions continued to utilize all six wafer stages as processing stages and to separate the processing of wafers from the transferring of wafers into two events. It was also believed that if one introduced a complicated mechanism inside a process environment, it would create a contamination problem for the wafers. Thus, most of the complicated robotic mechanisms used were in the load lock chamber and not in the transfer chamber where the processing occurred.

Thus, what is needed is a wafer transfer mechanism inside the transfer chamber that will allow the wafer loading time to substantially parallel the wafer processing time in order to increase throughput at a reduced cost and without introducing contamination concerns into the process environment.

SUMMARY

The present invention describes an apparatus and method for processing a wafer in a transfer chamber, while at substantially the same time, another wafer is being transferred between a load lock chamber and the transfer chamber of a wafer transfer system.

According to a preferred embodiment, the wafer transfer system comprises a transfer chamber having a wafer transfer blade disposed within the transfer chamber, a load lock chamber coupled to the transfer chamber, and a slider which moves the wafer transfer blade between the transfer chamber and the load lock chamber while processing continues in parallel in the transfer chamber. The wafer transfer blade is capable of transferring a wafer between the transfer chamber and the load lock chamber.

According to another embodiment of the present invention, a method of processing and transferring a wafer in a system comprising a load lock chamber and a transfer chamber having at least a stage (preferably six stages). The method comprises the following steps: providing radio-frequency (RF) power of a predetermined amount; providing a gas flow combined with RF power that will become a plasma with the desired ionic and/or neutral species; and determining a tact time, wherein the tact time is the sum of the processing time and the fin index time. The processing time is defined as the processing time that a wafer undergoes while on a processing stage. The fin index time is defined as the time that it takes for a first fin to transfer a wafer from one processing stage to another processing stage or between the wafer transfer blade and a processing stage. The loading time for the wafer substantially parallels the processing time and covers the following steps. First, the wafer transfer blade extends toward the load lock chamber to deposit the processed wafer into a shelf of the wafer holder. Second, the wafer transfer blade retracts. Third, the wafer holder indexes to the next wafer slot. Fourth, the wafer transfer blade extends and then the wafer holder indexes so that a new wafer is deposited on the wafer transfer blade. Finally, the wafer transfer blade retracts so that the new wafer is being processed in the transfer chamber. Thus, wafers are processed in the transfer chamber while new and processed wafers are transferred between the load lock chamber and the transfer chamber. The result is higher throughput, lower manufacturing costs, smaller space occupancy for the system and higher reliability.

BRIEF DESCRIPTION OF THE DRAWINGS

The present invention is illustrated by way of example and not a limitation in the figures of the accompanying drawings in which like references indicate similar elements and in which:

FIG. 2B illustrates a side view of a transfer chamber and a plasma source.

DETAILED DESCRIPTION

A transfer system and method for using the same are described for processing a substrate, such as stripping the resist from a wafer surface, in a transfer chamber, while at substantially the same time, another substrate or wafer is being transferred between a load lock chamber and the transfer chamber. In the following description, numerous specific details are given to provide a thorough understanding of the invention, such as the use of a magnetic motion coupling mechanism or the use of a vacuum chuck coupled to a platen. However, it will still be obvious to one skilled in the art that the invention may be practiced without these specific details. Moreover, in some instances, well-known semiconductor equipment and processes have not been set forth in detail in order not to unnecessarily obscure the present invention.

Figure 1:
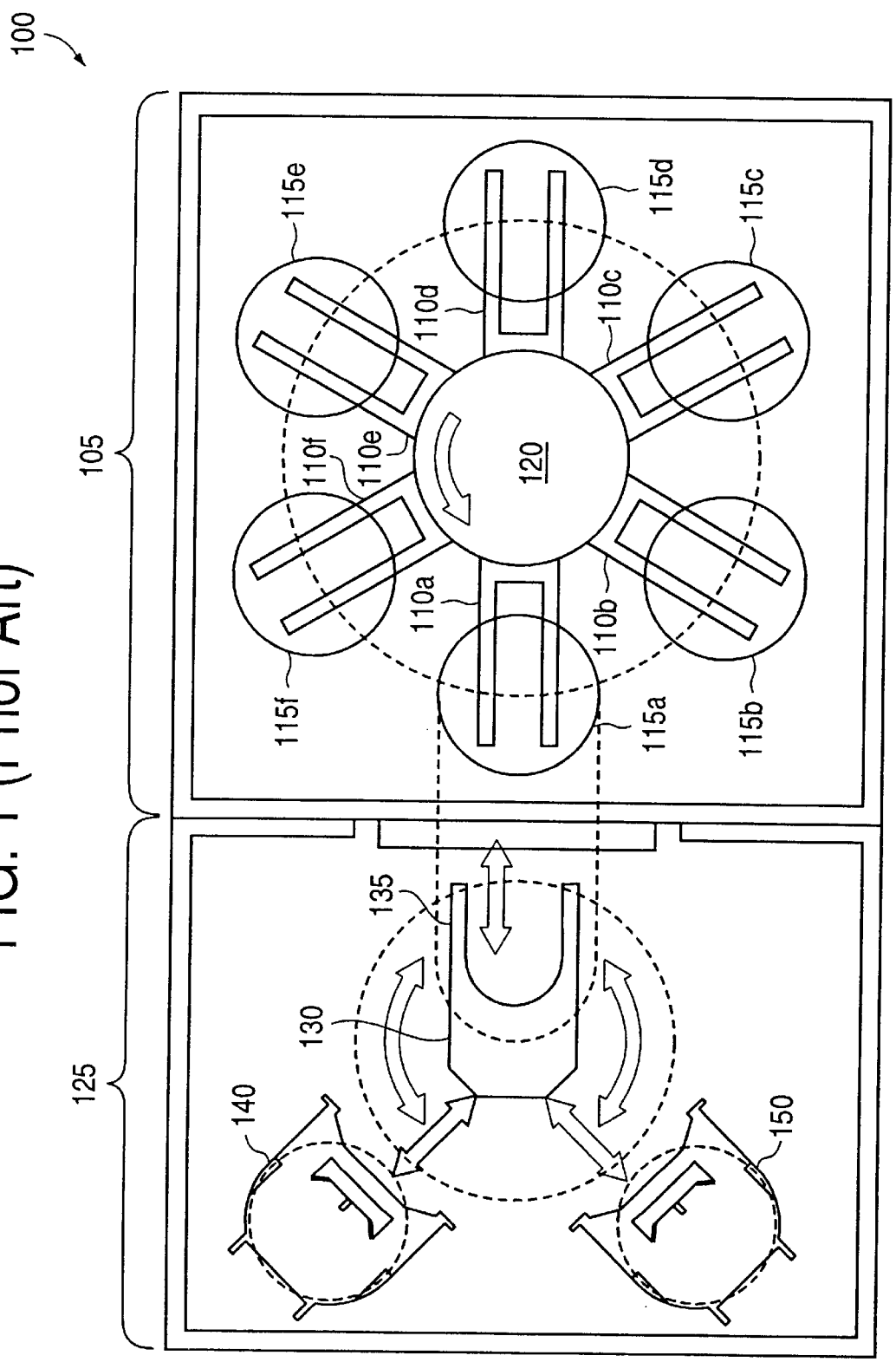
FIG. 1 is an example of a prior art processing system.
Figure 2:
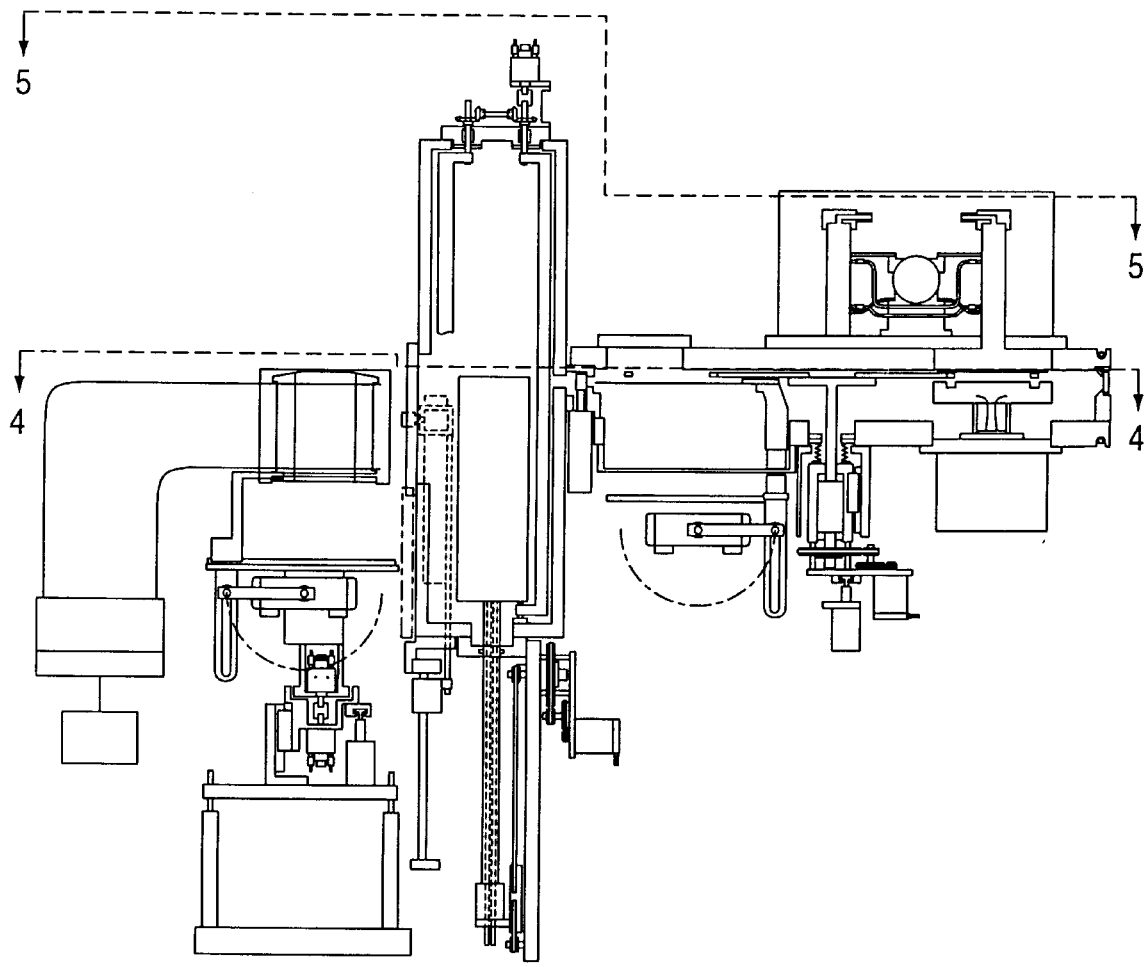
FIG. 2 illustrates a side view of the present wafer transfer system.
Figure 2A:
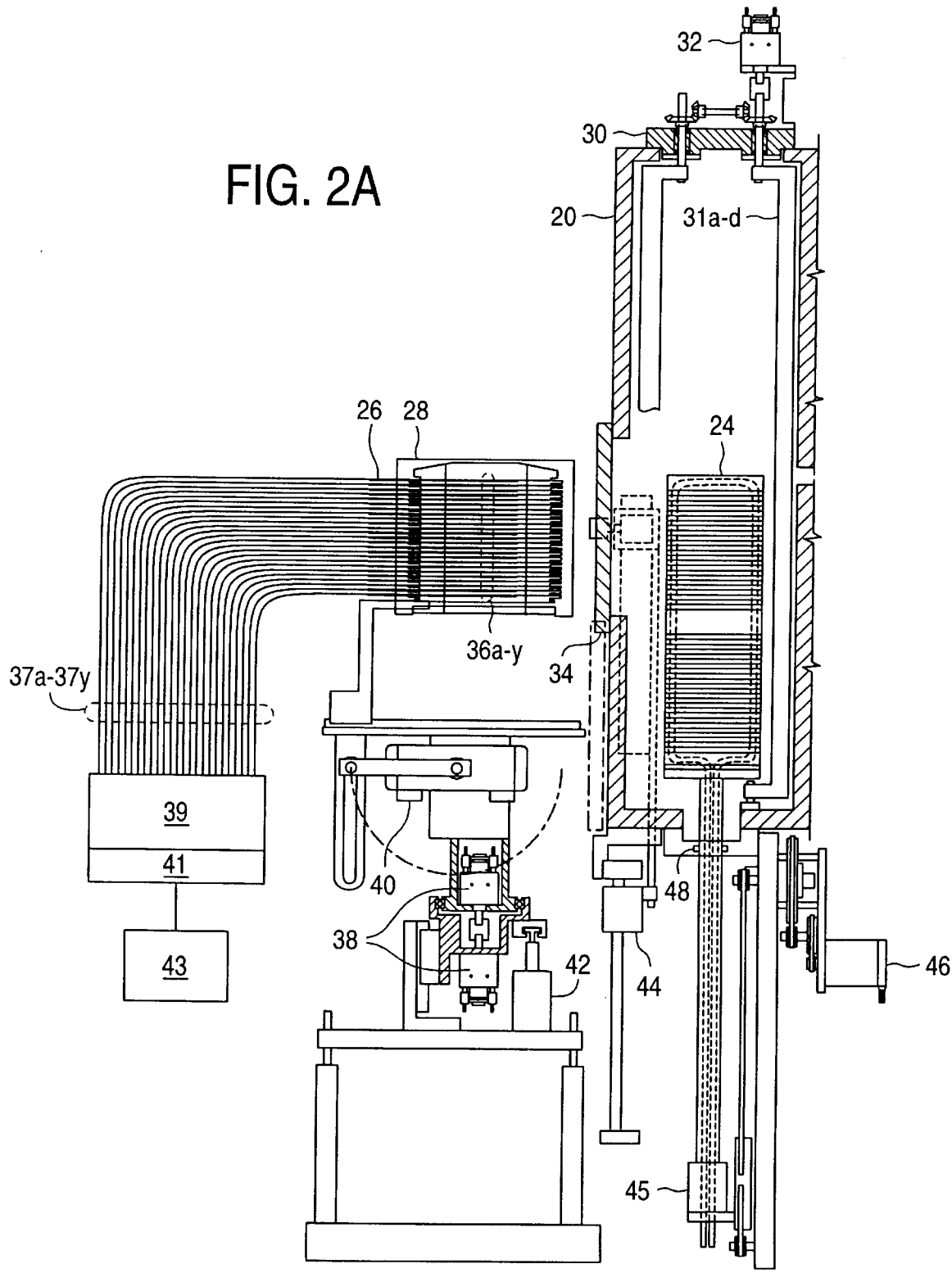
FIG. 2A illustrates a side view of an robot and a wafer holder.

FIG. 2 discloses an apparatus and method for stripping the photoresist from a wafer surface, while at substantially the same time, another wafer is transferred between the load lock chamber and the transfer chamber. A side view of a preferred embodiment of the present invention is illustrated in FIGS. 2, 2A and 2B. A load lock chamber 20 is connected to a transfer chamber 22 where the processing of a wafer occurs. A wafer holder 24 having a plurality of shelves is located in load lock chamber 20. The wafer holder 24 has a plurality of shelves for holding wafers before the wafers are transferred between the robot 26 and the transfer chamber 22. In a preferred embodiment, wafer holder 24 has two compartments, wherein each compartment has twenty-five shelves and is capable of holding twenty-five wafers.

As illustrated in FIG. 2A, robot 26 retrieves a new (not yet processed in transfer chamber 22) wafer from a cassette 28 located outside of the load lock chamber 20. According to a preferred embodiment, robot 26 has 25 platens $36a$–$36y$ which are capable of receiving twenty-five wafers at one time from cassette 28. Each platen $36a$–$36y$ is connected to its respective vacuum line $37a$–$37y$ which is connected to a manifold 39 which is then connected to a valve 41 and a vacuum pump 43.

As shown in FIG. 2A, rotation pneumatic actuator 38 allows robot 26 to rotate between gate valve 34 of load lock chamber 20 and cassette 28. Gate valve 34 is opened whenever a wafer is being transferred between load lock chamber 20 and transfer chamber 22. A retract-extend pneumatic actuator 40 allows robot 26 to extend toward cassette 28 or wafer holder 24 to either receive or transfer a wafer. Finally, an up-down pneumatic actuator 42 allows robot 26 to move up and down between the shelves of cassette 28 and the shelves of wafer holder 24. Unlike previous robots, the robot 26 is capable of receiving twenty-five wafers at one time from cassette 28 and then transferring all twenty-five wafers to the wafer holder 24. The converse of the prior sequence for robot 26 is also true. Thus, throughput is increased because robot 26 is able to transfer more than one wafer at a time.

Referring still to FIG. 2A, load lock chamber 20 has a wafer centering mechanism 30 controlled by a pneumatic actuator 32 which moves the four centering bars $31a$–$d$ to center the wafers within wafer holder 24 every time before a wafer is removed from wafer holder 24. Centering bars $31a$–$d$ are four vertical bars which operate in a synchronous manner on four rotating axises. In addition, load lock chamber 20 has a gate valve 34 which isolates it from the atmosphere and a slit valve 52 (see FIG. 2B) which isolates it from transfer chamber 22. Gate valve 34 remains closed when wafers are being processed in transfer chamber 22. The vertical motion of gate valve 34 is controlled by pneumatic actuator 44. In addition, motor 46 controls the up and down motion of wafer holder 24 while linear motion vacuum seal 48 helps maintain the vacuum tightness of load lock chamber 20. Moreover, linear guide 45 helps maintain the vertical motion of wafer holder 24.

Referring to FIG. 2B, service window 58 allows one to see the processing of a wafer in transfer chamber 22. A type of slider, such as wafer transfer blade 60, located below service window 58, is retracted and extended by a pneumatic actuator 50. Pneumatic actuator 50 is coupled to a magnetic motion coupling mechanism comprising a first magnet 54 located within transfer chamber 22 and a second magnet 56 located outside transfer chamber 22. First magnet 54 is coupled to first linear motion bearing 55 and second magnet 56 is coupled to second linear motion bearing 57 in one embodiment. Unlike previous systems, wafer transfer blade 60 is located inside transfer chamber 22 which allows the transfer of wafers to occur at substantially the same time or in parallel with the processing of wafers. In addition, wafer transfer blade 60 replaces a processing stage without reducing throughput.

In order to reduce the possibility of contamination, wafer transfer blade 60 moves in response to a simple magnetic motion coupling mechanism instead of a complicated gear or machine set. In one embodiment, when second magnet 56 moves, first magnet 54 also moves and since first magnet 54 is coupled to wafer transfer blade 60 through a thin aluminum wall, wafer transfer blade 60 also moves. It is to be appreciated that wafer transfer blade 60 may move in response to another mechanism without departing from the spirit and scope of the present invention. When slit valve 52 is open, wafer transfer blade 60 is able to extend into load lock chamber 20 to either receive a new wafer or deposit a processed wafer into a shelf of wafer holder 24.

In a preferred embodiment, there are seven fins 62A–62G located in transfer chamber 22. Only two fins 62a and 62c are shown in FIG. 2B. Each of the seven fins 62a–62g are connected to a central hub 64 which is connected to a drive shaft 74, bellows 76 and a rotation vacuum seal 78. Therefore, all seven fins 62a–62g rotate and move simultaneously. The rotation movement of the fins 62a–62g from one wafer stage 86 to another is controlled by a fin rotation motor 80. There are six wafer processing stages 86a–86f (only 86c is shown in FIG. 2B) which are arranged with wafer transfer blade 60 in a concentric manner in transfer chamber 22. In addition, the vertical motion of the fin 62 as it moves up and away from, a first wafer stage and down toward a second wafer stage, is controlled by pneumatic actuator 82. Each of the wafer stages 86a–86f has its own wafer stage controller 84a–84f but only one controller 84c is shown in FIG. 2B. A wafer 92 is shown on top of wafer stage 86.

Sometimes the temperature of transfer chamber 22 may be altered to facilitate processing. The temperature of transfer chamber 22 may be controlled by adding cold or hot water to a cooling or heating channels 88a and 88b. Channel 88a is used to heat or cool the lower surface of transfer chamber 22 and channel 88b is used to heat or cool the upper surface of transfer chamber 22. There is also a view port 90 through which one can look at the color of the plasma and wafer transfer motion to check for abnormalities during processing in transfer chamber 22.

The plasma source is located above wafer processing stages 86a–86f and is housed in RF shield 66 and comprises six quartz plasma tubes, but only two tubes 611, 612 are shown in FIG. 2B. RF shield 66 may be made of steel or aluminum. A gas inlet line 72 is shown entering a plasma tube 612 which is surrounded by an excitation coil 70 or an induction coil 70 which is wrapped around and coupled to two plasma tubes. A top view of the plasma source is discussed in FIG. 5 and one embodiment of its electrical circuit is illustrated in FIG. 6. A RF (radio frequency) tuning capacitor 68 is located between the two plasma tubes.

Figure 3:
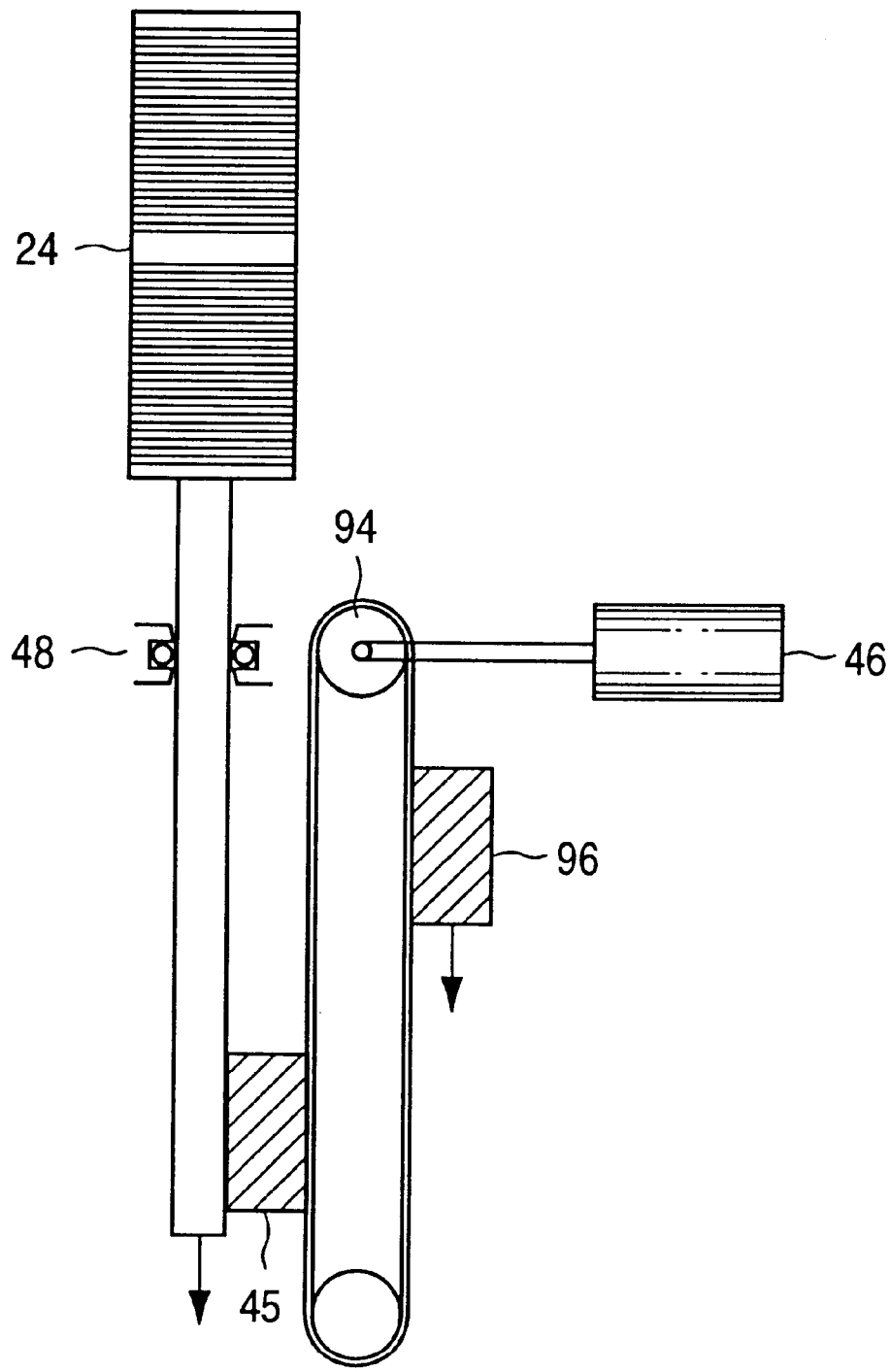
FIG. 3 illustrates the counterbalancing mechanism of the wafer holder, which is disposed within a load lock chamber.

A preferred embodiment of the counterbalancing mechanism of wafer holder 24 is illustrated in FIG. 3. The counterbalancing mechanism prevents wafer holder 24 from crashing and dropping the fifty or less wafers within it because of a power failure. The wafer holder 24 is made of aluminum because the heat from the processed wafers received from the transfer chamber 22 would melt the prior art plastic cassettes. Moreover, the plastic cassettes absorbed quite a bit of moisture from the air which was then outgassed or released into the load lock chamber. This adversely affected the cleanliness of the environment of the load lock chamber. This outgassing effect is decreased by using an aluminum wafer holder 24 with aluminum shelves. In addition, it is easier to control the accuracy of the system with an aluminum wafer holder 24 than with a plastic cassette.

Referring to FIG. 3, wafer holder's 24 counterbalancing mechanism is accomplished by using a lead counter-balance weight 96 of about 15–20 pounds which is almost the same weight of the wafer holder 24 and the weight of the wafers in the wafer holder 24 together. The drive pulley 94 is coupled to motor 46 which controls the vertical motion of wafer holder 24. Friction provided by linear motion vacuum seal 48 assures that the wafer holder 24 will not move in the event of a power failure. This creates a tremendous cost savings because no wafers are damaged or destroyed during a power failure. The savings are amplified when there are processed wafers in wafer holder 24. In contrast, under the prior art systems, the wafer holder dropped all the wafers when there was a power failure which resulted in a great financial loss and a decrease in throughput.

Figure 4:
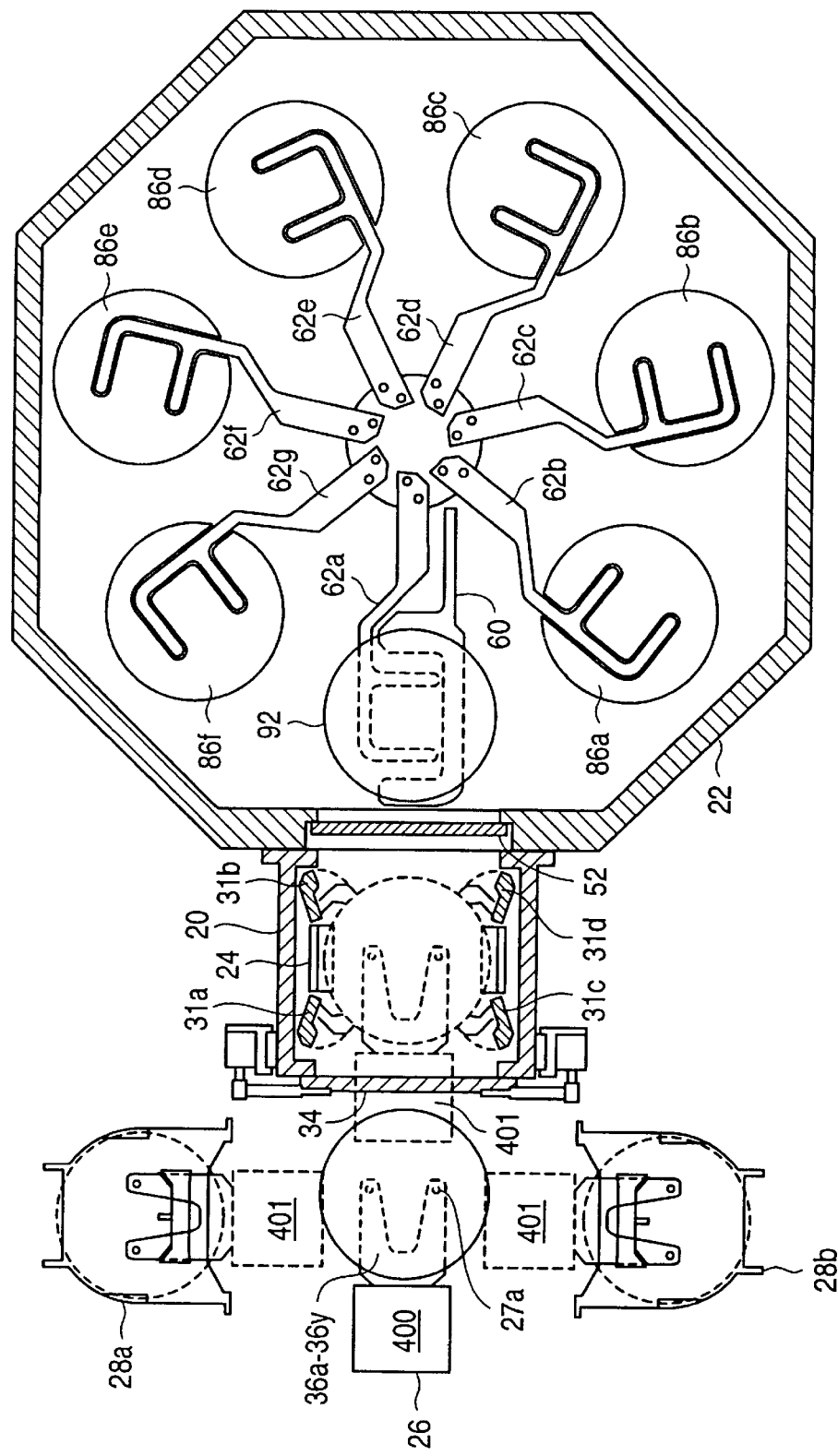
FIG. 4 illustrates one top view of the present invention which shows a wafer transfer blade, six processing stages and seven fins of the transfer chamber.

FIG. 4 illustrates a cross section of the wafer transfer system along cut-away line 4 of FIG. 2. In a preferred embodiment, there are two cassettes 28A and 28B and each of the cassettes is capable of holding twenty-five wafers. Robot 26 is capable of moving from a home position 400 to an extended position 401 in which its platens 36a–36y are extended into load lock chamber 20 and wafer holder 24 and then back to home position 400. Each of the platens (36a–36y of FIG. 2A) has its own vacuum chuck 27a–27y for supporting a wafer during transport. The robot 26 is also in extended position 401 when it is transferring unprocessed wafers from cassette 28a, for example, to wafer holder 24 or when it is receiving processed wafers from wafer holder 24 and returning them to cassette 28a. This example assumes that the wafers originally came from cassette 28a.

A wafer 92 is shown resting on top of wafer transfer blade 60 and fin 62A. According to a preferred embodiment, wafer transfer blade 60 moves back and forth between load lock chamber 20 and transfer chamber 22. All seven fins 62a–62g are connected to a common central hub 64; thus, all seven fins 62a–62g move simultaneously in a counterclockwise direction and move simultaneously in a vertical direction (i.e., up and down) when moving a wafer from one stage 86 to another stage 86 during processing. Each of the stages 86a–86f has its own independent temperature control. Thus, all the stages 86a–86f may be set at the same temperature or each at an entirely different temperature. Each fin 62 is capable of moving up with a wafer 92 on the end (not attached to central hub 64) and rotating in a counterclockwise direction to the next stage 86 and then downward with wafer 92 so that wafer 92 will rest on a different stage 86. In addition, the four centering bars 31A–31D also rotate to center the wafers within wafer holder 24 every time before a wafer is transferred. For example, centering bars 31*a*–*d* move toward each other to center a wafer before wafer transfer blade 60 extends into load lock chamber 20 to receive a wafer 92.

Figure 5:
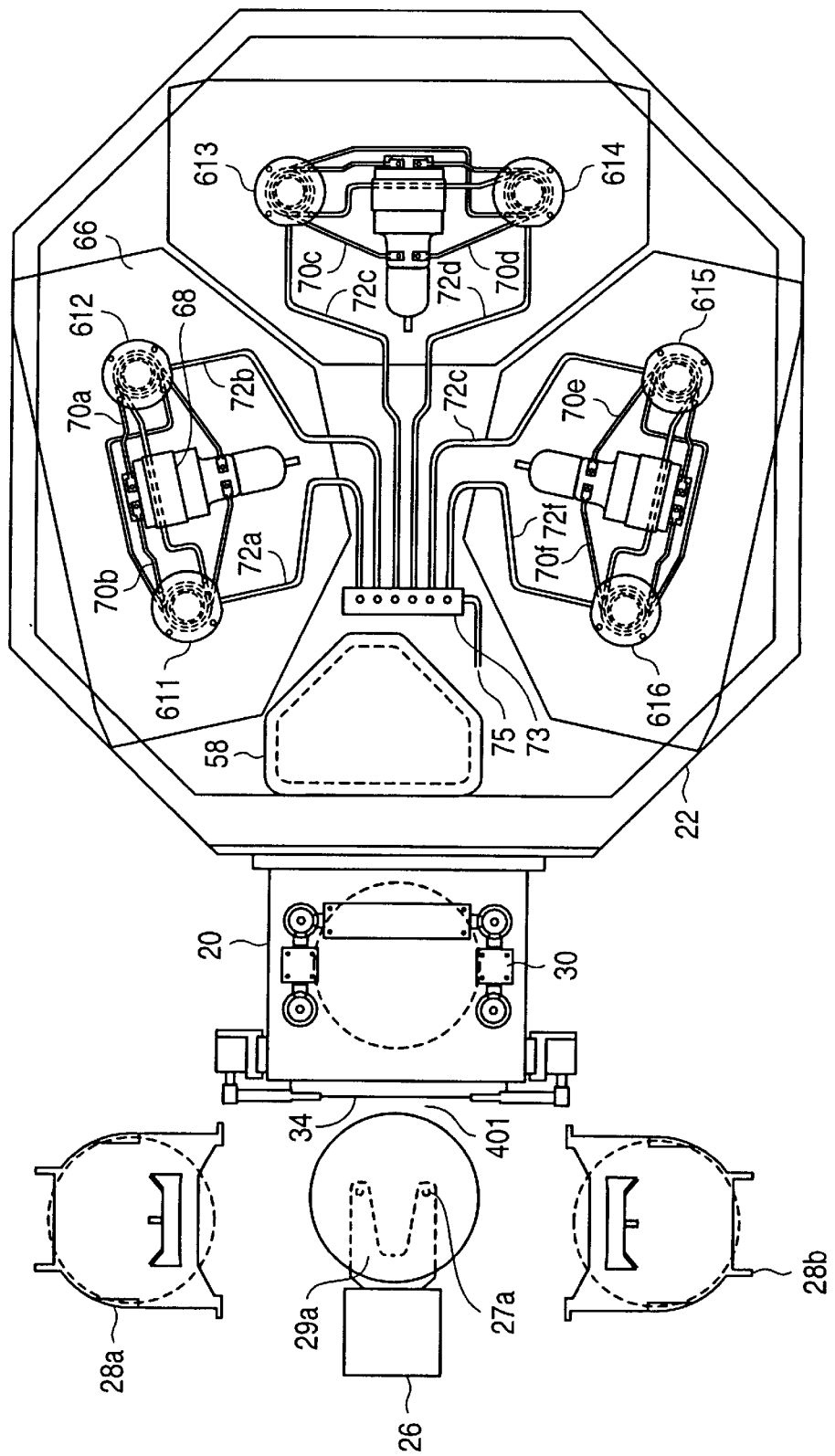
FIG. 5 illustrates another top view of the present invention's plasma source which located above the processing stages.
Figure 6:
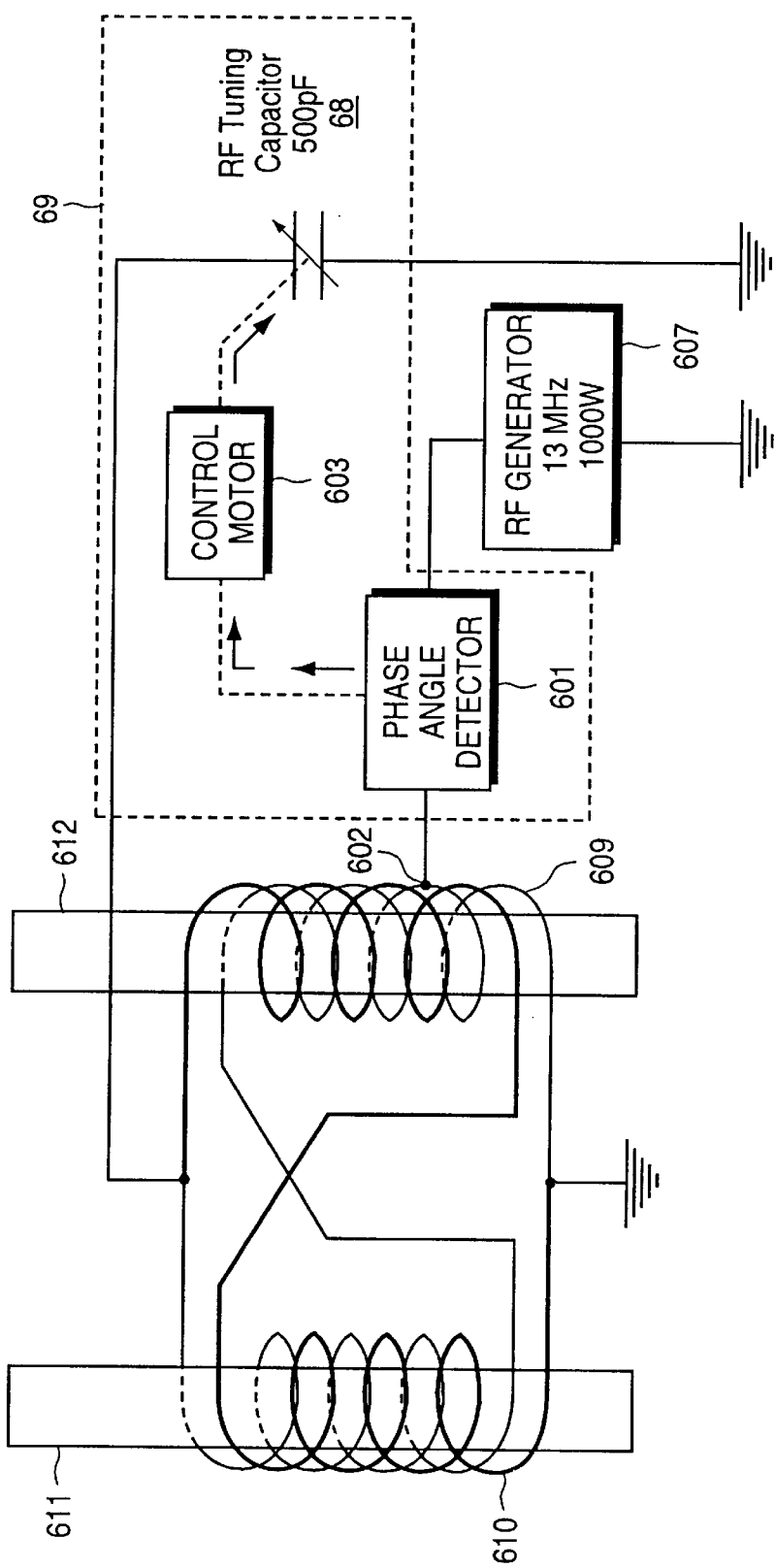
FIG. 6 illustrates one embodiment of the electrical circuit utilized in the plasma source of the present invention.

In FIG. 5, a cross section of the plasma source of the present invention is illustrated which is a cross section along cut-away line 5 of FIG. 2. According to a preferred embodiment, the plasma source comprises six plasma tubes 611–616, wherein there are three pairs of plasma tubes. Each plasma tube is located above a wafer processing stage. For example, plasma tube 611 is coupled to plasma tube 612 utilizing two induction coils 70*a* and 70*b*. Thus, there are two sets of induction coils shared by each pair of plasma tubes. Induction coils 70*c* and 70*d* are shared between plasma tubes 613 and 614. Plasma tubes 615 and 616 share induction coils 70*e* and 70*f*. Each plasma tube pair shares an RF tuning capacitor 68 and an RF generator (not shown). Stripping gas, such as oxygen, enters through the main gas inlet 75, then enters gas divider 73 which divides into six different gas inlet lines 72A–72F. Each gas inlet line 72 is connected to a plasma tube. As the gas passes through the inductive coils which surround the plasma tube, it becomes a charged plasma with electrons, radicals and charged ionic species.

Referring to FIG. 6, one embodiment of the electrical circuit of the plasma source is illustrated as a schematic. RF tuner 69 houses a phase angle detector 601 which is coupled to a control motor 603 and a tuning capacitor 68. The RF tuner 69 is also coupled to an RF generator 607 which produces about 700 to 1,000 watts of power at 13.56 MHz (MegaHertz). In a preferred embodiment, the RF power provided by RF generator 607 is transmitted through phase angle detector 601 and is connected to induction coil 609 (e.g., similar to 70*a* or 70*b*) at about 1.5 turns above the connection to ground at 602. The phase angle detector 601 causes control motor 603 to adjust RF tuning capacitor 68 so that the phase angle becomes 0 in order to maximize efficiency when the RF current is coupled to the plasma. If the phase angle is not 0, then the inductive coupling of the plasma source is not as efficient. Thus, only a fraction of the power provided by RF generator 607 reaches the plasma generated in plasma tubes 611 and 612. For example, if the phase angle is not 0, and 1,000 watts of power is provided, then only 500 watts of power reaches the plasma tubes so that the actual performance provided to the wafers below the plasma tubes are degraded. In one embodiment, the tuning of the phase angle to 0 (zero) is done by varying RF tuning capacitor 68.

Unlike prior systems, copper induction coils 609 and 610 are coiled differently. Under conventional methods, two identical but separate coils are used so that one coil circles each tube and each coil is connected in parallel to the other coil. The result is if there is a small geometrical difference between the wires or if there is a small difference in pressure between the two plasma tubes, then a difference in the plasma intensity between the two plasma tubes results. Thus, there would be an imbalance in the plasma intensity between the two plasma tubes. This imbalance becomes accelerated as more and more RF current tends to go to the brighter plasma tube (which has the greater plasma intensity). The imbalance between the two plasma tubes is then accelerated. As a result, an uneven plasma is generated from the plasma tubes. The processing of the wafers below the plasma tubes is degraded because of an uneven etch rate caused by the difference in power densities between the plasma tubes. In addition, because one plasma tube is receiving more power, that plasma tube also tends to degrade at a faster rate than the dimmer (weaker plasma intensity) plasma tube. Thus, manufacturing costs increase when a plasma tube must be prematurely replaced.

In contrast, one embodiment of the present invention uses one copper wire 610 which is inductively coupled to both tubes 611 and 612 while another copper wire 609 is also inductively coupled to both tubes. The first end of induction coil 609 is connected to RF tuning capacitor 68. It then wraps around plasma tube 611 then crosses over and circles plasma tube 612 and then its second end connects to ground. The mirror image occurs with induction coil 610. A first end of induction coil 610 connects to the RF tuning capacitor 68 potential then wraps around plasma tube 612, then crosses over and circles plasma tube 611 and then its second end is connected to ground. The result is that small imbalances of plasma intensity between the two plasma tubes 611 and 612 will not cause more RF current to flow to the plasma tube with a slightly higher (brighter) plasma intensity. Since both induction coils 609 and 610 are equally coupled to both plasma tubes 611 and 612, an imbalance in RF current will not occur. Thus, both plasma tubes will provide an even etch rate to their respective wafers and the plasma tubes will not require premature replacement.

Figure 7:
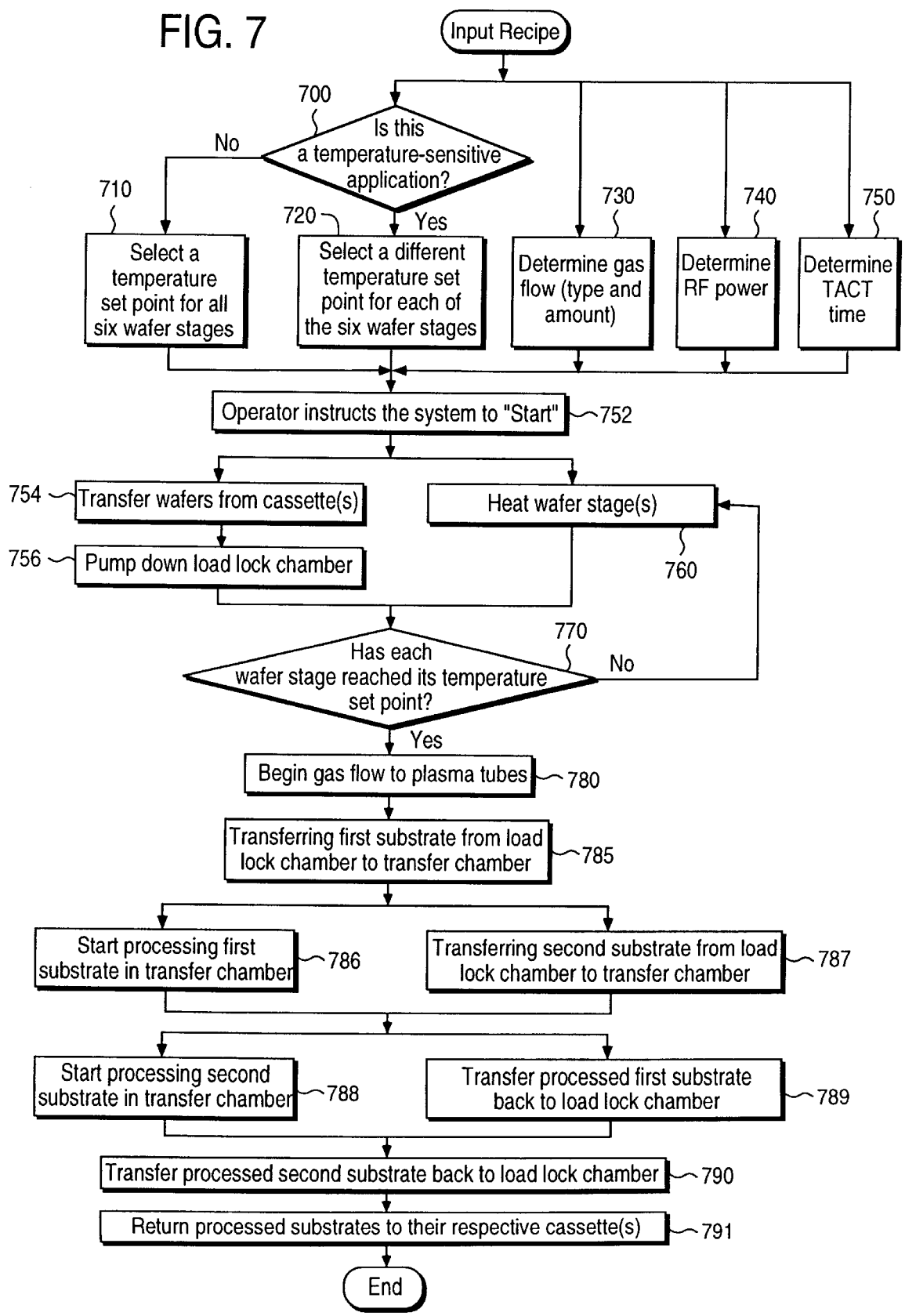
FIG. 7 is a flow chart of a preferred method of the present invention.

A flow chart of a preferred method of the present invention is illustrated in FIG. 7. According to a preferred embodiment, an operator selects a recipe by determining certain parameters using a type of control system, such as a computer program. As shown in diamond 700, an operator decides whether a temperature sensitive application is desired. If a non-temperature sensitive application is selected, then the operator may select a temperature set point for all six wafer stages as shown in step 710 and illustrated in FIG. 8.

Figure 9:
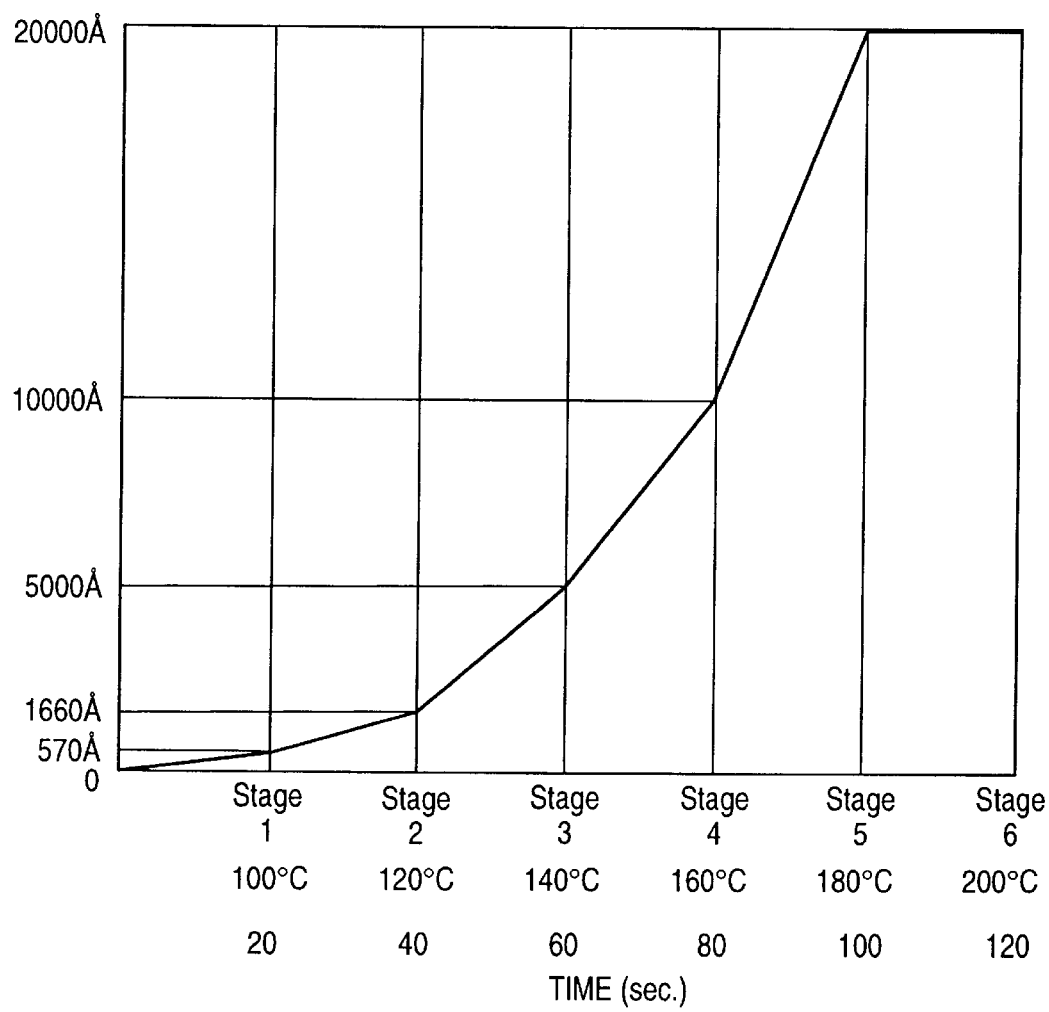
FIG. 9 is a graph illustrating the amount of resist removed over time per processing stage based on a temperature sensitive application of the present invention.

If a temperature sensitive application is desired, then the operator will select a different set point for each of the six wafer processing stages, as shown in step 720 and FIG. 9. Photoresist removal after an ion implantation step (e.g., a heavy arsenic dope) is an example of a temperature sensitive application. Because each of the six wafer processing stages has its own temperature control, it provides the advantage of allowing a slow heat-up during the photoresist strip process. If the wafer surface is exposed to an abrupt increase in temperature, then good process performance is not obtained because of a phenomenon known as "explosion" of the resist film. In other words, the photoresist film explodes if the wafer is heated too suddenly. The present invention is designed to avoid "explosion" by the gradual heat-up of the wafer and also by applying RF power incrementally since the RF power also adds heat to the wafer surface. In parallel, an operator may also determine the gas flow, such as the type and the amount in sccm (standard cubic centimeters) of gas provided as shown in step 730.

In tandem, an operator may determine the amount of RF power to be provided and the tact time, as shown in steps 740 and 750, respectively. In a preferred embodiment, the RF power provided may be selected from a range of about 500 watts (w) to about 1000w for two wafer stages coupled to the same RF tuning capacitor 68. The radio frequency applied is between about 200 kiloHertz (kHz)–27 megaHertz. According to a preferred embodiment, a total of 3 kw (kilowatt) of power is provided and the radio frequency is set at about 13.56 mHz. The tact time is defined as processing time plus fin index time. Theoretically, the tact time selected may be from fifteen seconds to infinity. A typical tact time is 20 seconds which is significantly lower than the tact time of 42 seconds obtained under the prior art system 100. The processing time is the amount of time that a wafer spends on a processing stage. As earlier defined, the fin index time is the time it takes for one fin to move up from a first stage while carrying a wafer, rotating to a second stage, then moving down and depositing that wafer on the second stage. According to a preferred embodiment, the fin index time is five seconds. The vacuum pressure inside the transfer chamber 22 may be set from atmospheric pressure to $10^{-3}$ torr. However, a vacuum pressure of two (2) torr is selected under a preferred embodiment.

Once the temperature set point is selected for each of the six wafer processing stages, then heat is immediately provided to the wafer processing stages as shown in step 760. In one embodiment, an operator places from one to twenty-five wafers into a cassette. An operator may also use two cassettes. An operator may choose to put twenty-five wafers into a cassette or only one wafer. If an operator places one wafer at the top shelf of the cassette and then another one at the bottom of the same cassette, the system will assume that there are wafers in the empty shelves so as not to degrade tact time. The amount of time that a wafer spends in the transfer chamber 22 is critical because that is when the wafer is exposed to the plasma under a certain temperature. Thus, the present invention is designed so that a wafer will get the same amount of processing time regardless of whether there are two wafers or twenty-five wafers in a cassette. Thus, process performance does not decline if less than the maximum number of wafers is processed in the transfer chamber 22.

The operator inputs a process recipe and then in step 752 instructs the system to start transferring wafers from one or two cassettes to load lock chamber 20 as shown in step 754. Meanwhile, the heaters that heat the wafer processing stages begin to warm up as shown in step 760. In addition, the load lock chamber is pumped down to vacuum in step 756.

As shown in diamond 770, the system will check to see if each wafer processing stage has reached its temperature set point. If the answer is "yes", the system will begin gas flow to the plasma tubes as shown in step 780. According to a preferred embodiment, a gas flow comprising 90% $O_2$ (oxygen) gas and 10% $N_2$ (nitrogen) gas is used. In another embodiment, a gas flow comprising 90% $O_2$ gas and 10% $CF_4$ is used. By this point, the system is operating automatically based on the selected parameters. It is to be appreciated that the parameters may be pre-selected in the software without departing from the spirit and scope of the patent invention.

The transfer sequence of step 754 will be discussed in greater detail. The robot will rotate to the first cassette, and then extend its twenty-five platens into first cassette to pick up, for example, twenty-five wafers. Without touching the wafers, the robot will fully extend its twenty-five platens which are then moved up by about 0.1 inch. Next, the vacuum chuck for each platen is turned on in order to hold each wafer in place. Each of the platens will then retract and return back to home position. The robot then rotates toward the load lock chamber 20. The twenty-five platens then extend away from the robot and into the load lock chamber 20. The vacuum chuck 27 then releases so that there is no more vacuum suction on the platens 36a–36y. The wafer holder 24 moves up by 0.1 inch in order to pick up all twenty-five wafers from the platens. The twenty-five wafers are then transferred into the twenty-five shelves of the first or second compartment of the wafer holder 24. The centering mechanism 31a–31d then closes to center the wafers. The twenty-five platens 36a–36y retract back to home position and then the centering mechanism opens again. It will be apparent that the same sequence is repeated if wafers are transferred from a second cassette.

Two events happen simultaneously. The wafer holder 24 moves to the next compartment so that the next compartment's shelves are adjacent to the gate valve and are ready to receive the next twenty-five wafers from a second cassette. This example assumes the operator wants to process fifty wafers. At the same time, the robot 26 will repeat the same sequence for the second cassette as it retrieves the twenty-five wafers and transfers them to the wafer holder 24. While this has been happening, the transfer chamber 22 has been under vacuum and the slit valve 52 has been closed. Once the robot has finished transferring the twenty-five wafers from the second cassette into the wafer holder 24, the gate valve 34 is closed.

The load lock chamber 20 is then pumped down from atmospheric pressure until it reaches the same pressure as the transfer chamber 22. At the same time, the wafer transfer system begins flowing gas into the plasma generation tubes and controlling the transfer chamber 22 pressure by controlling a throttle valve (which is not shown). The transfer chamber 22 is generally at a pressure of about 200 milliTorr (mT) when the wafer transfer system is idle. As shown in diamond 770 and step 780, the system will not start the gas flow until each of the wafer processing stages has reached its temperature set point. During the processing of wafers, the transfer chamber 22 is set at about 2,000 mT according to a preferred embodiment. In one embodiment, about 3,000 sccm of $O_2$ gas is released into the plasma tubes. In yet another embodiment, 300 sccm of $N_2$ gas is also released with the $O_2$ gas into the plasma tubes.

In order to ignite the plasma, a selected amount of RF power is applied to induction (excitation) coils. The phase angle detector 601 starts measuring the phase angle. The difference in phase angle is sent to the control motor 603 as part of a feedback control loop. The control motor 603 then adjusts the RF tuning capacitor 68 in order to set the phase angle at 0. The RF tuning capacitor 68, in turn, controls the phase of the RF current provided to the induction coils. The transfer chamber 22 is now ready to receive wafers for processing as the pressure, the gas flow, the temperature of wafer processing stages and the RF power are all within a predetermined range.

The slit valve 52 is opened and the transfer sequence (see step 785) begins in order to allow the start of processing of a first substrate (e.g., wafer) in the transfer chamber 22 as shown in step 786. The wafer holder 24 will move to a shelf where the first wafer is located, often it is the top shelf; however, an operator may set the system so that the first wafer is at the bottom of the wafer holder 24 and the last wafer is on the top shelf. The wafer transfer blade 60 will extend into the wafer holder 24 and at the same time, the centering bars 31a–31d will center the wafers by moving toward each other and then opening. The wafer transfer blade 60 is inserted beneath the first wafer which is on the top shelf. The wafer holder 24 will then move down by about 0.1 inch so that the wafer is now resting on the wafer transfer blade 60. The wafer transfer blade 60 retracts to home position so that it and the wafer are within the transfer chamber 22. A wafer is processed the moment the wafer enters the transfer chamber 22 (even before a wafer is placed on a wafer stage 86) as the plasma immediately begins to strip the resist from the wafer surface.

The fin index motion occurs when the wafer is resting on the wafer transfer blade 60 and a first fin (e.g., 62a). This first fin will then move up and then rotate by about 51.7 degrees (or one-seventh (1/7) of a 360° turn) to a first processing stage (e.g., 86*a*) and then it will move down until the wafer rests on a first stage. At the same time, the wafer holder 24 will move up to expose a second wafer on the shelf beneath the top shelf. A second wafer (or substrate) is transferred from the load lock chamber 20 and into the transfer chamber 22, as shown in step 787, during the processing of the first wafer as seen in step 786. Although FIG. 7 shows two substrate transfers, the entire sequence is repeated six times until there are six wafers and each wafer is on one of the six processing stages within the transfer chamber 22. For example, at one point, when the fifth wafer is being transferred from the load lock chamber 20 to the transfer chamber 22, the first, second, third, and fourth wafer are being processed on the fourth, third, second and first wafer stage, respectively. The first processing stage is the first stage that a wafer is processed on. All six stages are connected to ground in one embodiment. However, in another embodiment, the first processing stage, which is located in a counterclockwise direction from the wafer transfer blade 60, may be RF biased in order to process a particularly hardened resist known as a "shell" on the wafer surface.

Once the first wafer has been processed on each of the five previous stages and is on the sixth processing stage, the fin index motion transfers that first wafer back to the wafer transfer blade 60. The wafer holder 24 which was on the sixth shelf will now move back to the top shelf where this first wafer originated. The wafer transfer blade 60 then extends into the top shelf of the wafer holder 24. The wafer holder 24 moves up by about 0.1 inch so that the processed wafer is returned to the top shelf. The wafer transfer blade 60 then retracts to home position so that it is inside the transfer chamber 22. Then, the wafer holder 24 will move to the seventh shelf so that the wafer transfer blade 60 may then pick up and transfer this unprocessed seventh wafer into the transfer chamber 22. After the seventh wafer is introduced into the transfer chamber 22, the system repeats the above transfer sequence (transferring an unprocessed wafer from the load lock chamber 20 to the transfer chamber 22 and a processed wafer from the transfer chamber 22 to the load lock chamber 20) thirty-six times. Each wafer is transferred from stage 86 to stage 86 until each wafer has been processed on all six stages 86*a*–86*f*. The unloading sequence is repeated a final seven times (without transferring any unprocessed wafers) when the last seven processed wafers are unloaded from the transfer chamber and returned to their original shelves on the wafer holder 24. The above transfer and unloading sequence is designed for the processing of fifty wafers although not shown in great detail in FIG. 7. As shown in steps 788 and 789, a processed wafer may be returned to the load lock chamber 20 while another wafer continues to be processed in the transfer chamber 22. At the end of the process, all of the processed wafers are returned to their original shelves in the wafer holder as shown in step 790. Finally, in step 791, all of the processed wafers are transferred form the wafer holder 24 to their respective cassette(s).

Furthermore, once all fifty processed wafers are returned to their original shelves in the wafer holder 24, the slit valve 52 is closed so that the load lock chamber 20 is isolated from the transfer chamber 22. It is to be appreciated that the system may process less than fifty wafers at one time. The wafer transfer system then turns the RF power off and stops gas flow into the plasma tubes (e.g., 611 and 612). The throttle valve is then opened to bring the pressure in the transfer chamber 22 back to its base pressure of about 200 mT. The wafer transfer system starts introducing nitrogen gas into the load lock chamber 20 for venting purposes. In a preferred embodiment, about 100 sccm of nitrogen gas will be introduced until the pressure in the load lock chamber 20 reaches about 10 torr and then the main venting valve (not shown) is opened until the pressure in the load lock chamber 20 reaches pressure.

The gate valve 34 is then opened and another wafer unloading sequence begins. First, the centering bar mechanism 31*a*–*d* centers the wafers in the wafer holder 24. Second, atmospheric robot 26 extends its twenty-five platens 36*a*–36*y* into the wafer holder 24. The centering mechanism 31*a*–*d* then opens after centering the wafers. The wafer holder 24 then moves down by about 0.1 inch so that all twenty-five wafers are resting on the twenty-five platens 36*a*–36*y*. The vacuum chuck 27*a*–27*y* for each platen 36 is turned on so that each wafer is chucked onto its respective platen 36. The platens 36*a*–36*y* retract back to home position. Next, the robot 26 rotates with its twenty-five platens toward the first cassette. The robot 26 will then extend its twenty-five platens 36*a*–36*y* toward the first cassette. The vacuum chuck 27 is then turned off and the robot 26 moves down by about 0.1 inch so that all twenty-five platens 36*a*–36*y* retract to home position after the twenty-five wafers are returned to their original shelves in the first cassette. In parallel motion, as the robot 26 is rotating toward the first cassette, the wafer holder 24 is moving its second compartment upward so that the next twenty-five wafers may then be unloaded and returned to their original slots in the second cassette. This example assumes that fifty wafers were processed.

It is to be appreciated that the stripping of photoresist from the wafer surface is not the only process utilizing the present invention. For example, another process is light etching to remove a damaged silicon layer or to remove the organic deposition after a contact etch. In addition, a chemical vapor deposition process may be performed under the present invention but the plasma source is capacitively coupled instead of inductively coupled.

Figure 8:
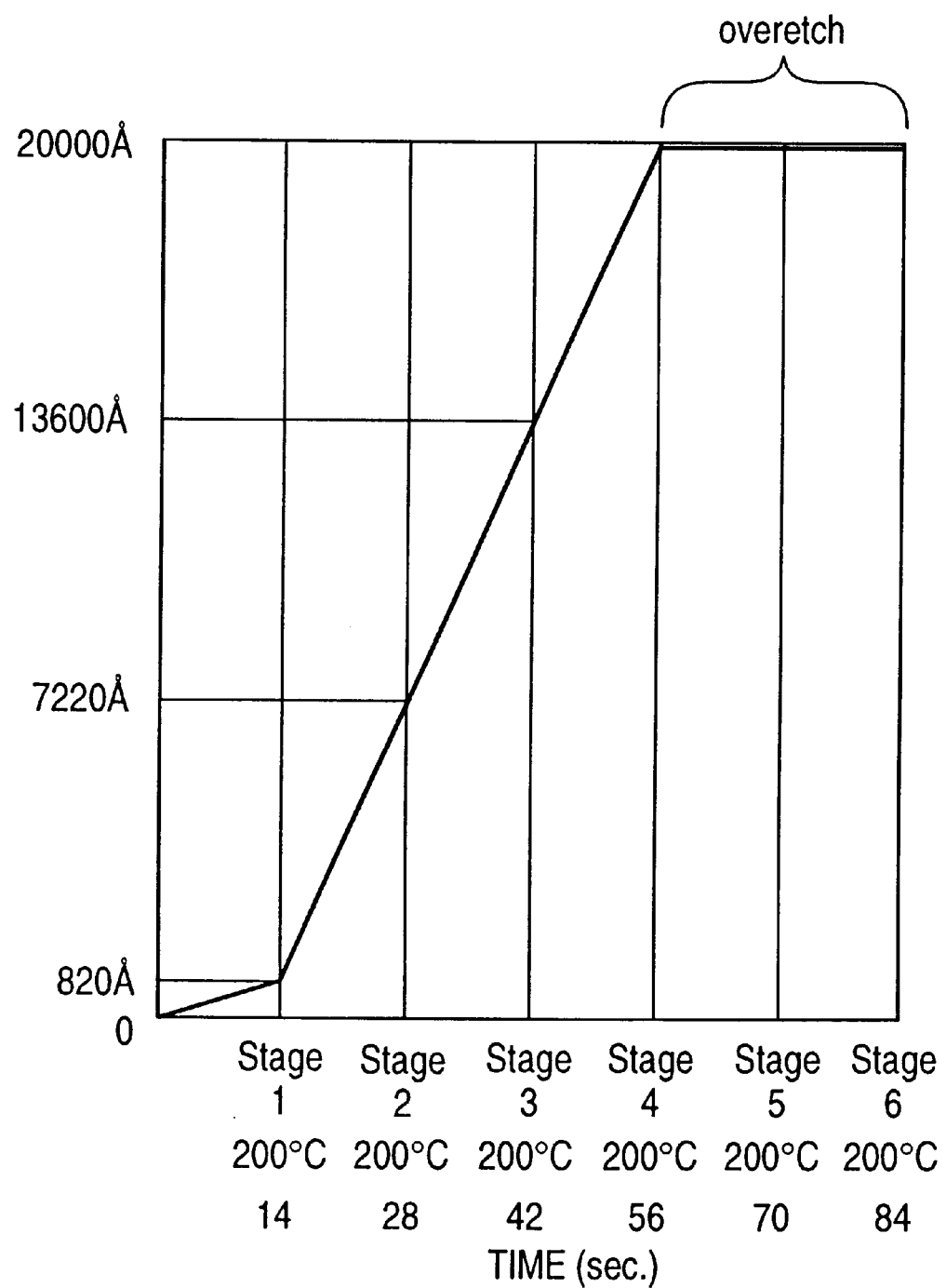
FIG. 8 is a graph illustrating the amount of resist removed over time utilizing a non-temperature sensitive application of the present invention.

A graph of the amount of resist removed or ashed during a typical non-temperature sensitive application of the present invention is illustrated in FIG. 8. All six wafer processing stages are set at 200° C. The cumulative time elapsed is shown on the x-axis below each wafer processing stage. At station 1, 820 (eight hundred and twenty) angstroms of resist was stripped from the wafer surface. A dramatic increase is seen by the time the wafer leaves stage 2, as a total of 7220 angstroms has now been removed from the wafer surface. At stage 3, a total of 13,600 angstroms of resist has been removed while a total of 20,000 angstroms of resist has been removed by the time the wafer leaves stage 4. A total of fifty-six seconds has elapsed. Overetching or removal of any residual resist occurs at processing stages 5 and 6. Thus, a typical non-temperature sensitive stripping process should take about eighty-four seconds for one wafer. Generally, about 15,000–20,000 angstroms of photoresist is removed per wafer. In a typical non-temperature sensitive application, the temperature set point for each of the stages may range from room temperature to about 200° C.

In FIG. 9, a graph of the etch rate or the amount of resist ashed utilizing a temperature sensitive application of the present invention is illustrated. The cumulative amount of photoresist etched or ashed per wafer is shown on the Y axis while the cumulative amount of time elapsed in seconds and the temperature of each wafer processing stage is shown on the X axis. Each of the wafer processing stages is set to a different temperature set point to allow a gradual heat-up of the wafer. The first wafer stage is set at 100° C., the second wafer processing stage at 120° C., the third stage at 140° C., and so on in 20° C. increments until a temperature of 200° C. is achieved at processing stage 6. It is to be appreciated that the numbers shown in the graph illustrate only one application of the present invention and that other temperature ranges may be selected depending on the particular application desired.

In general, the slope of the amount etched is not as sharp for a temperature sensitive process as it is for a non-temperature sensitive process. This is because the gradual heat-up of the wafer in a temperature-sensitive process results in a slower etch rate. At the end of the wafer's processing time at stage 1, only 570 angstroms of resist was removed as compared to the 820 angstroms removed in the typical non-temperature sensitive application. The difference is most dramatic at stage 2 where only a total of 1,660 angstroms has been removed by the time the wafer leaves processing stage 2 after forty seconds elapsed. In sharp contrast, a total of 7,220 angstroms was removed after twenty-eight seconds in the non-temperature sensitive application. A total of 3,340 angstroms (5,000 minus 1,660) is removed at processing stage 3 in FIG. 9. After eighty seconds, a cumulative total of 10,000 angstroms is removed at the end of processing stage 4. Finally, the etch is completed at processing stage 5 and the overetch occurs at processing stage 6 after 120 seconds have elapsed. In the typical example, about 15,000 to 20,000 angstroms of resist is ashed or removed per wafer. In another embodiment, the first processing stage is set at 80° C., the second processing stage at 105° C., the third processing stage is set at 130° C., and a fourth processing stage is set at 155° C. while the fifth stage is set at 180° C. and the sixth stage at 210° C.

One advantage of having independent temperature control for each wafer stage and plasma source is that during the overetch step, the temperature and RF power may be lowered to minimize driving sodium and other contaminants into the wafer (being processed). Another advantage is that independent temperature control allows a gradual heat-up of a wafer which prevents "explosion" of the wafer surface during processing. The result is financially beneficial as the loss of wafers due to "explosions" is significantly decreased.

In the above description, numerous specific details, such as the use of oxygen as a stripping gas, the number of shelves in the wafer holder or the use of a particular temperature set point, are given to be illustrative and not limiting of the present invention. It would still be clear to one skilled in the art that the spirit and scope of the invention may be practiced without these specific details. Moreover, in some instances, well-known semiconductor equipment and processes have not been set forth in detail in order not to unnecessarily obscure the present invention. Thus, the apparatus and method of the present invention is defined by the appended claims.

Thus, an apparatus and method have been described for stripping the photoresist from a wafer while in a substantially parallel manner, another wafer is being transferred between a load lock chamber and a transfer chamber, where the processing occurs. The wafer transfer system of the present invention allows increased throughput with decreased manufacturing costs and without introducing any contamination concerns.

We claim:

1. An apparatus for transferring and processing a plurality of wafers, comprising:
    a transfer chamber within which processing of said plurality of wafers takes place;
    a load lock chamber coupled to said transfer chamber;
    a transfer blade located within said transfer chamber, said transfer blade being capable of transferring said plurality of wafers one at a time from said load lock chamber to said transfer chamber or from said transfer chamber to said load lock chamber while others of said plurality of wafers are being processed within said transfer chamber;
    a plurality of plasma sources coupled to said transfer chamber wherein each of said plurality of plasma sources is capable of generating a plasma, and comprises:
        a tube having a first end and a second end, said first end of said tube being disposed above said transfer chamber and said second end of said tube being disposed within said transfer chamber;
        an induction coil having a first end and a second end, said first end of said induction coil being connected to an RF power source, said second end of said induction coil being connected to ground, said induction coil being spiral-wound around said tube between said first end and said second end;
        a gas source coupled to said first end of said tube; and,
    said plurality of plasma sources are arranged in a plurality of pairs of plasma sources wherein each plasma source of said pair of plasma sources shares the other's induction coils; that is, said induction coil of a first of said pair of plasma sources is spiral-wound around said tube of said first of said pair of plasma sources and also spiral-wound around said tube of a second of said pair of plasma sources while said induction coil of said second of said pair of plasma sources is spiral-wound around said tube of said second of said pair of plasma sources and also spiral-wound around said tube of said first of said pair of plasma sources.

2. The apparatus of claim 1 wherein said transfer blade comprises:
    a first magnet coupled to said transfer blade wherein said first magnet is located adjacent to the interior surface of a wall of said transfer chamber; and,
    a second magnet located adjacent to the exterior of said wall of said transfer chamber wherein said second magnet is operatively connected to said first magnet such that movement of said second magnet results in a corresponding movement of said first magnet and said transfer blade coupled to said first magnet.

3. The apparatus of claim 1, comprising a robot wherein said robot is:
    operatively connected to said load lock chamber; and,
    located external to said load lock chamber.

4. The apparatus of claim 3 wherein said robot comprises a plurality of platens, each of said plurality of platens being capable of supporting one of said plurality of wafers.

5. The apparatus of claim 4 wherein each of said plurality of platens comprises a vacuum chuck.

6. The apparatus of claim 5 comprising a plurality of cassette holders wherein each of said plurality of cassette holders is:
    independently capable of holding said plurality of wafers; and,
    operatively connected to said robot such that said robot is capable of delivering to or receiving from each of said plurality of cassettes independently all of said plurality of wafers in said cassette at once.

7. The apparatus of claim 6, wherein said plurality of cassette holders comprises two cassette holders.

8. The apparatus of claim 1, comprising a plurality of stages located within said transfer chamber, wherein each of said plurality of stages is capable of supporting one of said plurality of wafers during processing in said transfer chamber while said transfer blade is transporting another of said plurality of wafers from said load lock chamber to said transfer chamber or from said transfer chamber to said load lock chamber.

9. The apparatus of claim 1 wherein each of said plurality of plasma sources is located above one of said plurality of stages.

10. The apparatus of claim 9 comprising a hub centrally located within said transfer chamber.

11. The apparatus of claim 10 wherein said plurality of stages and said transfer blade are located equally spaced around the circumference of a circle having said hub as its center point.

12. The apparatus of claim 11, comprising a plurality of fins wherein each of said plurality of fins has a first end and a second end, said first end being capable of supporting one of said plurality of wafers and said second end being coupled to said centrally located hub.

13. The apparatus of claim 12, wherein said plurality of fins is capable of moving in a synchronous manner about said centrally located hub.

14. The apparatus of claim 13 wherein each of said plurality of fins is capable of moving one of said plurality of wafers between one of said plurality of stages and another of said plurality of stages or between one of said plurality of stages and said transfer blade.

15. The apparatus of claim 12 wherein said plurality of fins comprises seven fins.

16. The apparatus of claim 8, wherein the temperature of each of said plurality of stages is capable of being independently controlled.

17. The apparatus of claim 8 wherein said plurality of stages comprises six stages.

18. The apparatus of claim 1, wherein said load lock chamber comprises a wafer holder having a plurality of shelves capable of holding said plurality of wafers.

19. The apparatus of claim 18 wherein said wafer holder is made of aluminum.

20. The apparatus of claim 18, wherein said wafer holder is capable of holding fifty wafers.

21. The apparatus of claim 18, wherein said wafer holder comprises a counterbalancing means for supporting said wafer holder in the event of a power failure.

22. The apparatus of claim 18, wherein said wafer holder is coupled to a centering means capable of centering said plurality of wafers within said wafer holder.

23. The apparatus of claim 1, wherein said load lock chamber comprises a gate valve coupled to said load lock chamber wherein when said gate valve is open said load lock chamber is open to external atmosphere and when said gate valve is closed said load lock chamber is isolated from said external atmosphere.

24. The apparatus of claim 23 wherein said load lock chamber comprises a slit valve operatively coupled to said load lock chamber wherein when said slit valve is open, said load lock chamber is open to said transfer chamber and, when said slit valve is closed, said load lock chamber is isolated from said transfer chamber.

25. The apparatus of claim 1, comprising:

a plurality of RF generators each of which is independently coupled to one of said plurality of pairs of plasma sources wherein each of said RF generators is capable of independently generating RF power; and, a plurality of RF tuners each of which is independently coupled to one of said plurality of RF generators.

26. The apparatus of claim 25 wherein said RF tuner comprises:

a phase angle detector;

a tuning capacitor; and, a control motor wherein said control motor is capable of adjusting said tuning capacitor such that the phase angle between said RF power and said induction coil is zero.

27. The apparatus of claim 1 wherein said plurality of wafers comprises twenty-five wafers.

* * * * *